United States Patent
Lockwood et al.

[11] Patent Number: 5,898,576
[45] Date of Patent: Apr. 27, 1999

[54] PRINTED CIRCUIT BOARD INCLUDING A TERMINATED POWER PLANE AND METHOD OF MANUFACTURING THE SAME

[75] Inventors: John J. Lockwood, Dublin; Edward J. Pavlu, III, San Jose, both of Calif.

[73] Assignee: Bay Networks Inc., Santa Clara, Calif.

[21] Appl. No.: 08/747,397

[22] Filed: Nov. 12, 1996

[51] Int. Cl.$^6$ .............................. H05K 7/02; H05K 9/00
[52] U.S. Cl. ................... 361/782; 361/212; 361/794; 361/818; 174/35 R; 174/255; 333/181
[58] Field of Search .................... 361/212, 220, 361/766, 780, 782, 794, 803, 811, 818; 333/12, 22 R, 181, 184, 185, 24 C, 246; 174/255, 260, 35 R

[56] References Cited

U.S. PATENT DOCUMENTS

| | | | |
|---|---|---|---|
| 4,437,140 | 3/1984 | Ohyama et al. | 361/782 X |
| 5,068,631 | 11/1991 | Vince | 333/12 |
| 5,130,677 | 7/1992 | Takai | 333/12 |
| 5,155,656 | 10/1992 | Narashimhan et al. | 361/309 |
| 5,371,403 | 12/1994 | Huang et al. | 257/691 |
| 5,469,324 | 11/1995 | Henderson et al. | 361/301.2 |
| 5,488,540 | 1/1996 | Hatta | 361/752 |
| 5,708,296 | 1/1998 | Bhansali | 257/698 |
| 5,708,400 | 1/1998 | Morris | 333/12 |
| 5,729,183 | 3/1998 | Schuchmann et al. | 333/1 |
| 5,736,796 | 4/1998 | Price et al. | 307/151 |

*Primary Examiner*—Leo P. Picard
*Assistant Examiner*—Jayprakash N. Gandhi
*Attorney, Agent, or Firm*—Blakely, Sokoloff, Taylor & Zafman LLP

[57] ABSTRACT

A printed circuit board including a terminated power plane is described. Specifically, the power-ground plane construction includes a dielectric layer, a power plane having a peripheral edge, and a ground plane. The ground plane is spaced from the power plane by the dielectric layer, and is positioned in an opposed relationship to the power plane. The power-ground plane construction also includes a termination element coupling the power plane, at or adjacent the peripheral edge thereof, to the ground plane so as to terminate the power plane. In one embodiment, a plurality of termination elements couple the power plane, at or adjacent the peripheral edge thereof, to the ground plane. The termination elements are spaced from each other at substantially regular intervals. In another embodiment, a termination element is a strip or sheet element coupling continuous lengths of the peripheral edge of the power plane to ground plane.

25 Claims, 10 Drawing Sheets

PRINTED CIRCUIT BOARD INCLUDING A TERMINATED POWER PLANE AND METHOD OF MANUFACTURING THE SAME

FIELD OF THE INVENTION

The present invention pertains to the field of printed circuit boards. More particularly, the present invention relates to a printed circuit board having a terminated power plane and to a method of manufacturing such a terminated printed circuit board.

BACKGROUND OF THE INVENTION

The inclusion of a capacitive decoupling network between the power and ground planes of a printed circuit board (PCB) is well known and desirable for a number of reasons. Specifically, decoupling capacitance may be provided in the form of discrete decoupling capacitors connected between the power and ground planes of the PCB, the discrete decoupling capacitors being located adjacent loads, which typically comprise integrated circuits (ICs) mounted on the PCB. Decoupling capacitance is also provided in the form of intrinsic (or interplanar) capacitance, particularly in multi-layer PCBs, by the parallel location of the power and ground planes within a PCB. This decoupling capacitance serves to provide fast risetime current to the ICs and to minimize differential voltages that may develop between the power and ground planes of the PCB, as a result of IC switching events, by isolating the switching currents as "local events. This in turn reduces the potential of the PCB to radiate and conduct electromagnetic interference (EMI).

FIG. 1 shows an equivalent circuit 10 for an integrated circuit 12 and a decoupling capacitor ($C_d$) 14 mounted on a PCB. The intrinsic or interplanar capacitance is represented by the capacitor ($C_0$) 16. The power plane is represented by the line 18, and the ground plane by line 20.

The power plane of a PCB should ideally exhibit zero impedance, and it is desirable to minimize the impedance of power planes as much as possible. FIG. 2 is a graph showing power plane impedance (Z) versus frequency (MHz) for an example power-ground plane construction within a PCB having a number of discrete decoupling capacitors mounted thereon. The graph plots the impedance of the power plane, with the PCB configured as a "bare board" (i.e. a PCB without any discrete capacitors mounted thereon), with broken line 22, and the impedance of the power plane, with the PCB having discrete decoupling capacitors mounted thereon, with solid line 24. As is apparent from the graph, the impedance increases dramatically at operating frequencies above a series resonant frequency ($f_1$) due, inter alia, to the presence of the discrete decoupling capacitors, and the impedance theoretically becomes infinite at a parallel resonant frequency ($f_3$). The impedance of a PCB employing discrete decoupling capacitors comprises the cumulative impedance of the power and ground planes, vias connecting these planes, traces between capacitors and ICs, and the capacitor mounting pads. The significant increases in the power plane impedance at high frequencies results in the performance of the PCB deteriorating substantially at these frequencies, at which the PCB may not function properly, or may exceed regulatory emission levels.

The series resonant frequency ($f_1$) is determined mainly by the number and location of the discrete decoupling capacitors. By optimizing the number and location of discrete decoupling capacitors, as well as other PCB characteristics, it is possible to shift the series resonant frequency ($f_1$) to higher frequencies as increased operating frequencies are encountered. However, PCB operating frequencies are being achieved at which it has become increasingly difficult, inefficient and expensive to match the series resonant frequency ($f_1$) to the PCB operating frequency.

SUMMARY OF THE INVENTION

According to a first aspect of the invention, there is provided a printed circuit board comprising a dielectric layer, a power plane having a peripheral edge, a ground plane spaced from the power plane by the dielectric layer, and a termination element coupling the power plane, at or adjacent a peripheral edge thereof, to the ground plane. A plurality of termination elements may couple the power plane, at or adjacent the peripheral edge thereof, to the ground plane, and the plurality of termination elements may be spaced from each other at substantially regular intervals.

In one embodiment, the power plane is substantially rectangular in shape and has first, second, third and fourth side edges, the plurality of termination elements coupling the power plane, at or adjacent the first side edge thereof, to the ground plane. The first and third side edges of the power plane are located at opposed ends thereof, and the plurality of termination elements may also couple the power plane, at or adjacent the first and third side edges thereof, to the ground plane. The plurality of termination elements may furthermore couple the power plane, at or adjacent the first, second, third and fourth side edges thereof, to the ground plane.

The termination element may, for example, comprise a tantalum capacitor, or lumped resistor and capacitor elements. In a further embodiment, the element comprises a strip element coupling the power plane, at or adjacent a continuous edge portion thereof, to the ground plane. The strip element typically has both resistive and capacitive elements, the resistive element comprising a resistor coupled to the power plane, at or adjacent a peripheral edge thereof, and the spacing between a plane coupled to the resistor and the ground plane creates an intrinsic capacitance to provide the capacitive element of the termination element.

According to a second aspect of the invention, there is provided a method of manufacturing a printed circuit board. The method including the steps of providing a dielectric layer having opposed first and second surfaces, locating a power plane, having a peripheral edge, and a ground plane, on the first and second surfaces respectively, so that the power and ground planes are in a spaced, opposed relationship to each other; and coupling a termination element between a location on the power plane, at or adjacent the peripheral edge thereof, and the ground plane so as to terminate the power plane. A plurality of termination elements may be coupled between the power plane, at or adjacent the peripheral edge thereof, and the ground plane, the termination elements being spaced from each other at substantially regular intervals.

In one embodiment, the power plane is substantially rectangular in shape and has first, second, third and fourth side edges, and the method includes the step of coupling the plurality of termination elements between the power plane, at or adjacent the first side edge thereof, and the ground plane. The method may also include the step of coupling the plurality of termination elements between the power plane, at or adjacent the first and third side edges thereof, and the ground plane. The method may include the step of coupling the plurality of termination elements between the power plane, at or adjacent the first, second, third and fourth sides edges thereof, and the ground plane.

In another embodiment, the method includes the step of coupling a strip element between the power plane, at or adjacent a continuous portion of the peripheral edge thereof, and the ground plane.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A terminated power plane for use in a PCB, and a method of manufacturing the same, are described below. In the following description, for purposes of explanation, numerous specific details are set forth in order to provide a thorough understanding of the present invention. It will be evident, however, to one skilled in the art that the present invention may be practiced without these specific details.

Figure 3:
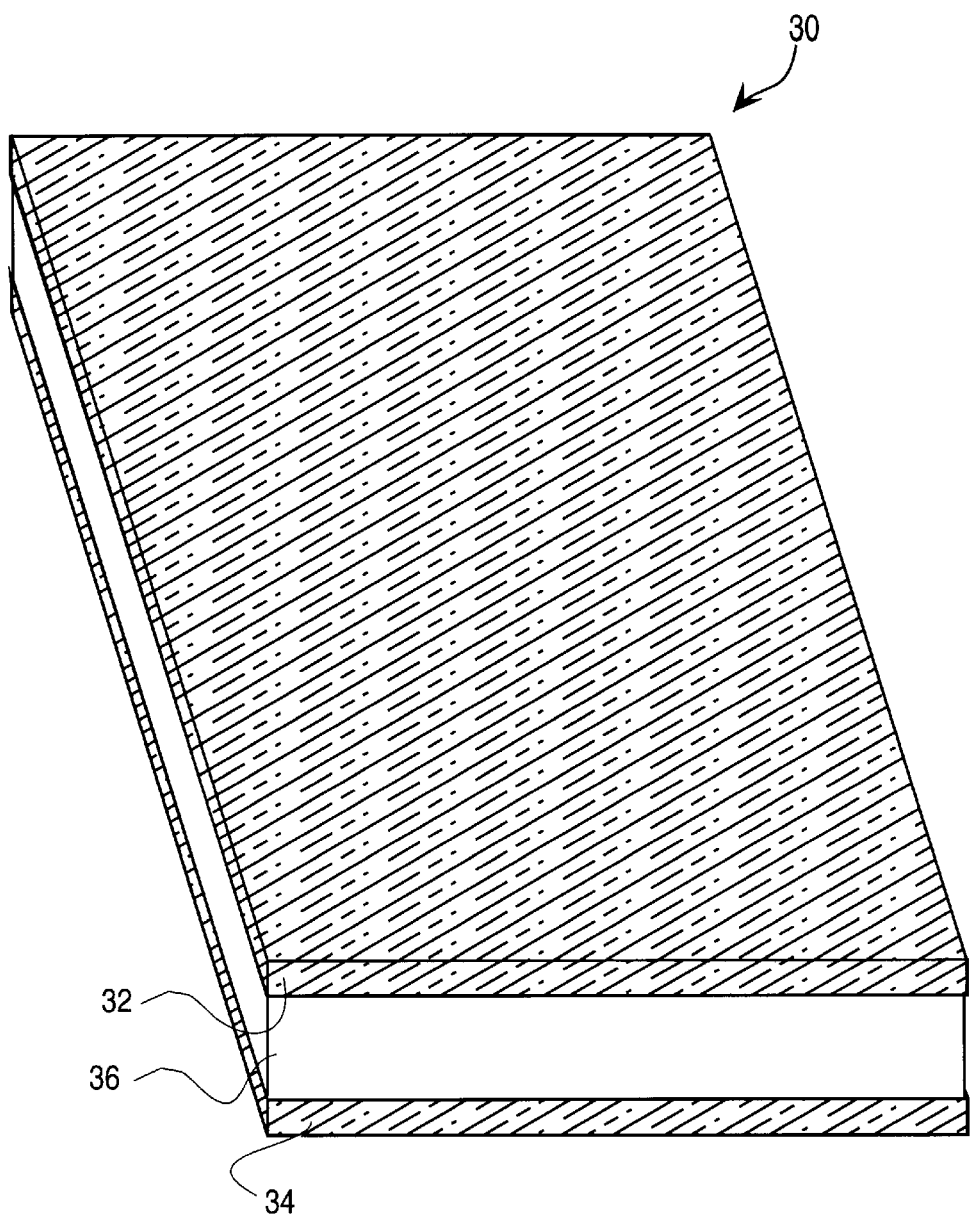
FIG. 3 is a pictorial view of a power-ground plane construction for use in a PCB.

Referring to FIG. 3, there is shown an pictorial representation of a power-ground plane construction 30, including a power plane 32, a ground plane 34, and a dielectric layer 36 sandwiched between the power plane 32 and the ground plane 34. The dielectric layer 36 serves to locate the power plane 32 and the ground plane 34 in an opposed, spaced relationship, and provides electrical isolation between the planes 32 and 34. And the planes 32 and 34 are typically constructed from copper, whereas the dielectric layer 36 may be formed from various materials, such as epoxy-fiberglass.

The power-ground plane construction 30 is commercially incorporated within a printed circuit boards (PCB), and provides a voltage supply, typically 5 volts, to integrated circuits (ICs) mounted on the PCB and coupled to the planes 32 and 34. A multi-layer PCB may include multiple power-ground plane pairings. While, for the purposes of this specification, only a single power-ground plane pairing will be discussed, it will really be appreciated that the teachings of the present invention can be applied to multiple power-ground plane pairings within a single PCB.

Electromagnetic Compatibility (EMC) design techniques have in the past sought to reduce electromagnetic interference (EMI) resulting from electromagnetic emissions from PCBs by providing decoupling capacitor networks between power planes 32 and ground planes 34 of PCBs. The present invention proposes a supplementary structure and method of addressing EMC problems within a PCB by seeking to reduce reflections, resonance, and noise that exists in a power-ground plane construction 30, as shown in FIG. 3.

As a starting point, the present invention proposes viewing the power-ground plane construction 30 as an unterminated section of a transmission line, with measurable quarter-, half- and full-wave length resonances. While decoupling capacitor networks are effective to lower the impedance of a power-ground plane pairing at lower frequencies, the pairing still exhibits the characteristics of an unterminated transmission line. Accordingly, in its most basic embodiment, the present invention proposes coupling a termination element between the power plane 32 and the ground plane 34 at or adjacent a peripheral edge of the power plane 32. Such a termination element may be used to terminate the power plane 32 into its characteristic impedance, thereby minimizing resonances on the power plane 32.

Below are described a number of embodiments of the present invention. In the first series of embodiments, a plurality of the discrete termination elements are coupled between an edge region of the power plane 32 and the ground plane 34. In the second series of embodiments, the termination element 48 comprises a continuous length, or strip element, which is coupled between a continuous portion of the edge of the power plane 32 and the ground plane 34.

Figure 4:
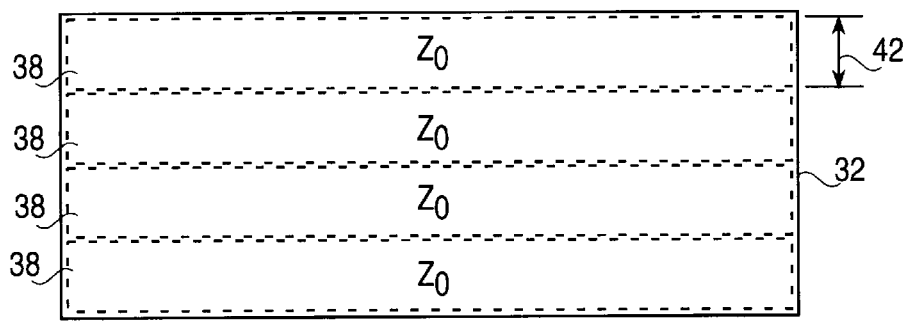
FIGS. 4 and 5 are plan views of a power plane illustrating the conceptual division of the power plane into longitudinal and transverse strips according to the present invention.
Figure 5:
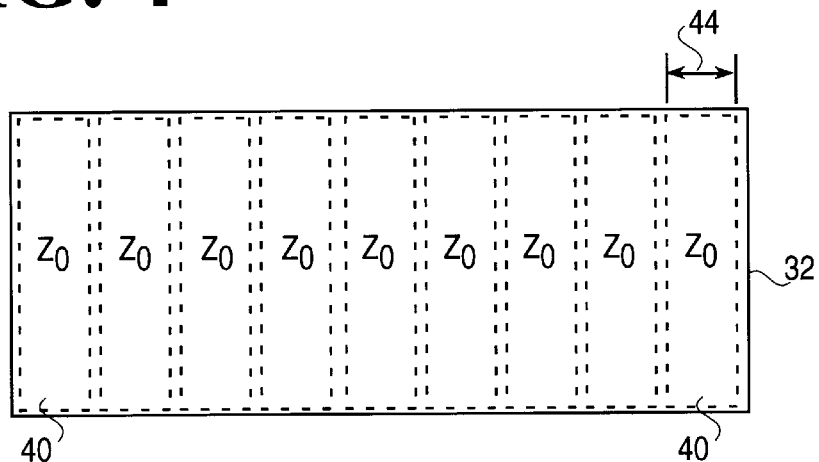

Referring firstly to FIGS. 4 and 5, plan views of the power plane 32 are shown. Conceptually, it is convenient to divide the power plane 32 into a plurality of longitudinal sections or strips 38, as shown in FIG. 4, and a plurality of transverse sections or strips 40, as shown in FIG. 5. The longitudinal strips 38 each have an approximately equal width 42, and the transverse strips 40 each have an approximately equal width 44. In a similar manner, the opposing ground plane 34 may also conceptually viewed as being divided into a plurality of longitudinal and transverse strips.

Figure 6:
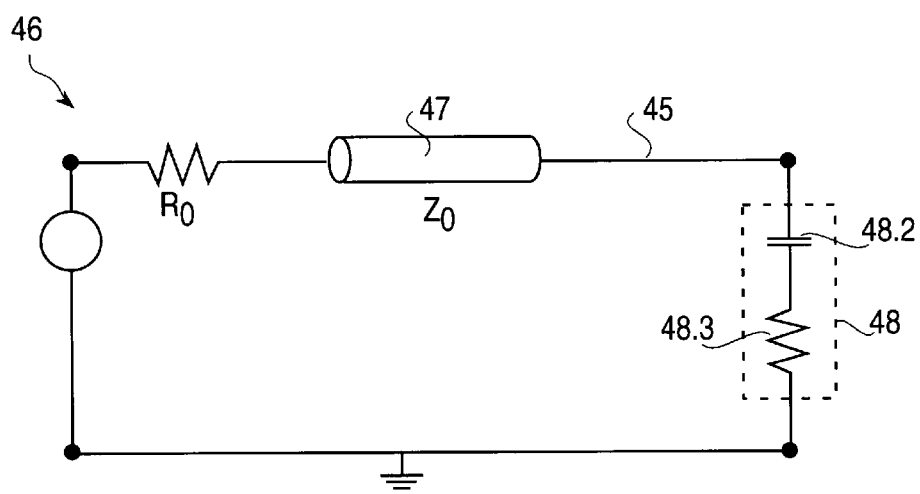
FIG. 6 shows an equivalent circuit representing a termination element coupled between a conceptual strip on the power plane and the ground plane of a PCB according to the invention.

Having conceptually divided the power plane 32 and the ground 34 into a plurality of strips as described above, pairs of corresponding strips in the power plane 32 and the ground plane 34 can each be viewed as a transmission line, and the power-ground plane construction can be viewed as a finite number of parallel transmission lines. Each strip pairing can be modeled accordingly by an equivalent circuit. Referring to FIG. 6, such an equivalent circuit 46 is illustrated, the intrinsic impedance of the respective strip 38 in the power plane 32 being represented by transmission line 47. The "power plane" 45 of equivalent circuit 46 is furthermore shown to be terminated by a termination element 48, comprising a capacitive component 48.2 and a resistive component 48.3. Accordingly, the present invention proposes terminating each of the power plane strips 38 or 40, into which the power plane 32 has been divided, with a discrete termination element 48.

Figure 7:
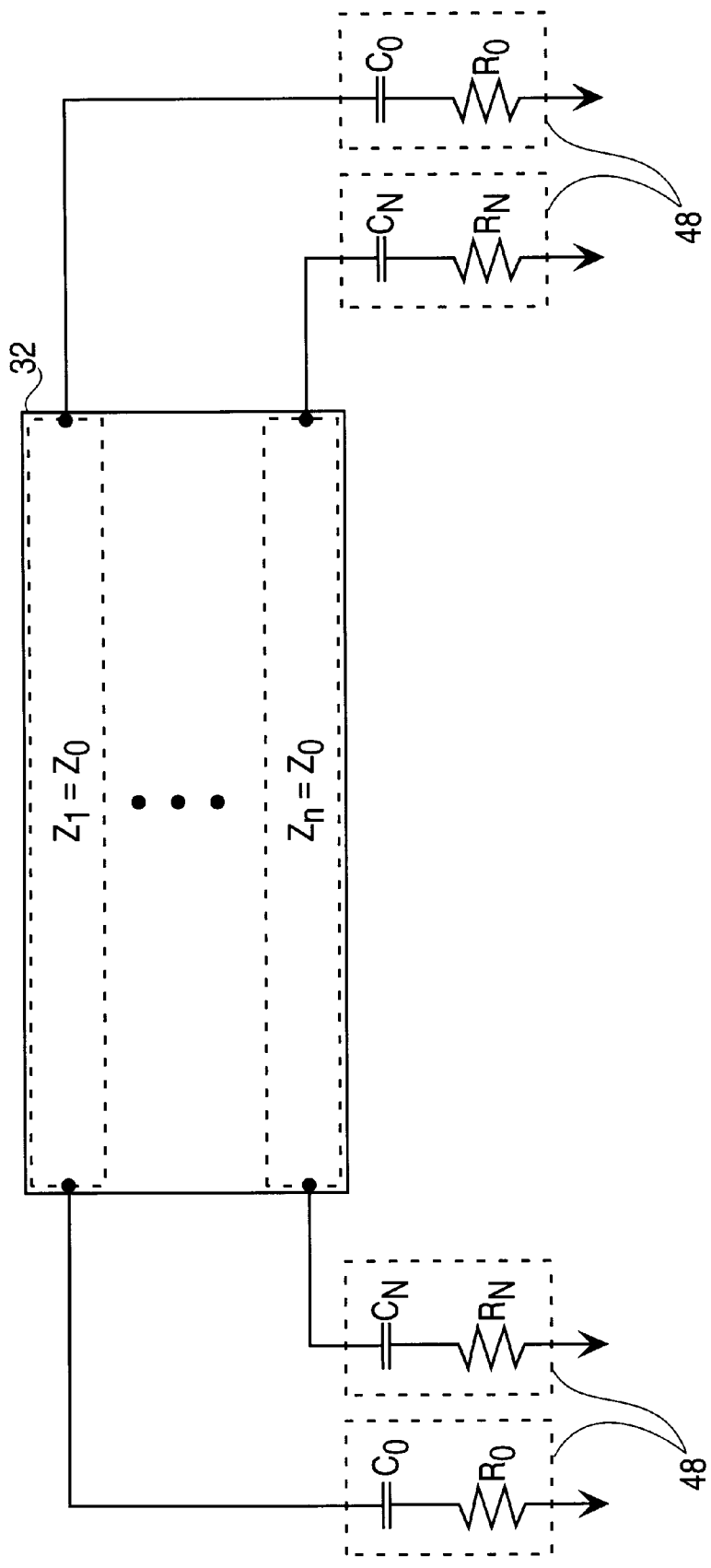
FIG. 7 shows termination elements coupled between conceptual strips on the power plane and the ground plane of a PCB according to the invention.

FIG. 7 shows a power plane 32 divided into N longitudinal strips, each of which is terminated to opposed minor ends thereof by a discrete and dedicated termination element 48 having resistive and capacitive properties. Each termination element 48 may comprise a combination of discrete resistive and capacitive components, or a single component having both capacitive and resistive properties. Referring to FIG. 7, the resistance value (R) of each termination element 48 should approximately equal the impedance value ($Z_0$) of each of the longitudinal strips. The capacitive property is required to prevent a direct current (DC) short circuit between the power and ground planes. More specifically, in one embodiment, the termination element 48 comprises a single resistor and a single capacitor connected in series between a peripheral edge portion of the power plane 32 and the ground plane 34. In a further embodiment, the termination element 48 comprises a single component having predetermined resistive and capacitive properties. Specifically, tantalum capacitors have a relatively high equivalent series resistance (ESR) which make these components particularly suited for use as termination elements. In summary, it is required that a termination element 48 have both a resistive and capacitive component, the resistive component acting as a lossy element between the power and ground planes, and having a resistive value sufficient to damp voltage reflections which arise in the power plane 32 and a capacitive component to prevent a short circuit as described above. Accordingly, it is desirable to use lossy capacitors, such as tantalum capacitors, which have a relatively high resistive characteristic, and which would otherwise be regarded as "low quality" capacitors, as termination elements to prevent the power and ground planes from being shorted by the capacitors. The equivalent series resistance (ESR) of these capacitors should ideally equal the characteristic impedance of the power plane.

Figure 8:
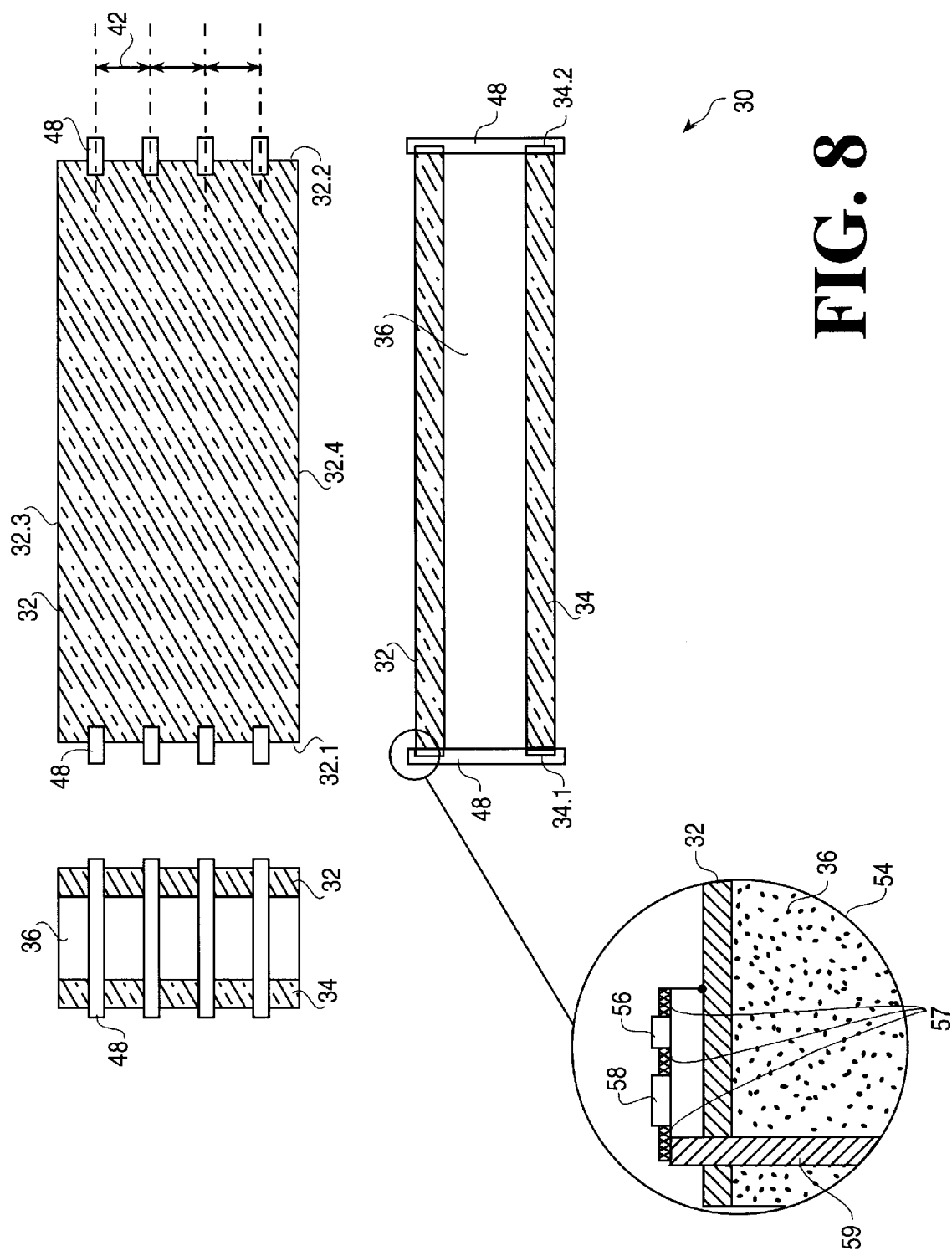
FIG. 8 shows plan and side views of a rectangular power-ground plane construction, the power plane being terminated at opposed minor edges thereof by discrete termination elements according to the present invention.

Referring now to FIG. 8 there is shown a plan view, and two side views of a power-ground plane construction 30 including a power plane 32, which has been terminated in accordance with the teachings of the present invention. Specifically, the power plane 32 and the ground plane 34 are rectangular in shape and each has four side edges. The power plane 32 has a pair of opposed minor side edges 32.1 and 32.2, and a pair of opposed major side edges 32.3. and 32.4. Similarly, the ground plane 34 has a pair of opposed minor side edges 34.1 and 34.2, and a pair of opposed major side edges 34.3 and 34.4. A set of termination elements 48 couple each of the minor side edges 32.1 and 32.2 of the power plane 32 to the ground plane 34. For illustrative purposes, each termination element is represented by a rectangle in FIG. 8, and subsequent drawings. It will of course be appreciated that the rectangles representing the termination elements 48 are symbolic, and are not intended to represent the form or dimensions of a termination element 48. Each termination element 48 may be integrally formed with the power or ground plane, or may be soldered, or otherwise electrically coupled, to either plane. It is furthermore not essential to the present invention that a termination element 48 be coupled at an edge of the power plane 32, but merely that it be coupled to a plane adjacent, for example within one inch of, an edge thereof. The ground plane 34 is further shown to be of equal size and dimensions to the power plane 32 only for illustrative purposes only. In a manufactured PCB, the ground plane may differ from the power plane in shape and size, and a termination element 48 may be coupled to the ground plane 34 at any location thereon, and not necessarily at or adjacent a peripheral edge thereof.

FIG. 8 also illustrates a detailed view at 54 of an example construction of a termination element 48, comprising a discrete capacitor 56 and a discrete resistor 58, coupled between the power plane 32 and the ground plane 34. The capacitor 56 is coupled by traces 57 to the power plane 32 and the resistor 58. The resistor 58 is in turn coupled by a trace 57 to a via 59, which extends through the power plane 32 and the dielectric layer 36, and is coupled to the ground plane 34. As shown in the example construction, the termination element may be coupled to the power plane 32 adjacent (and not exactly at) a peripheral edge thereof.

Each termination element 48 is furthermore spaced from adjacent termination elements 48 by an approximately equal distance 42, which corresponds to the width 42 of the conceptual strips into which the power plane 32 may be divided, as illustrated in FIG. 4. Each conceptual longitudinal strip 38, shown in FIG. 4, is terminated at a minor end thereof by a termination element 48. The spacing or distance 42 between adjacent termination elements 48 is chosen to provide adequate termination for a specific power-ground plane construction 30, and is determined by the dimensions of the power plane 32 and the frequency at which the power-ground plane construction 30 operates. The higher this frequency, the closer together the termination elements 48 are located.

Figure 9:
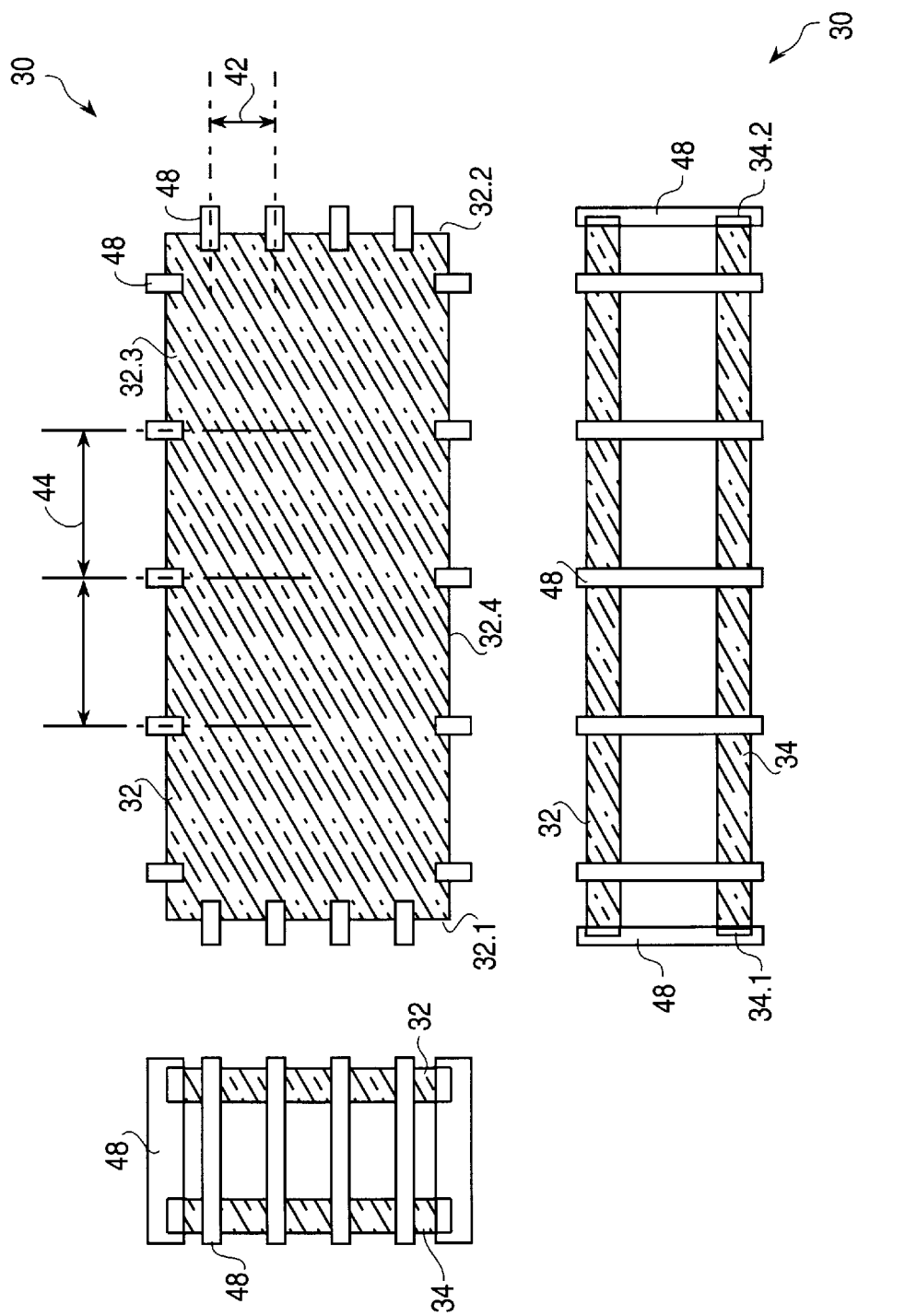
FIG. 9 shows plan and side views of a rectangular power-ground plane construction, the power plane being terminated at opposed minor and major edges thereof by discrete termination elements according to the present invention.

Turning now to FIG. 9, there is again shown a plan view, and two side views, of a further embodiment of a power-ground plane construction 30 according to the invention. The power plane 32 is terminated along both minor side edges of 32.1 and 32.2, and major side edges of 32.3 and 32.4, in the manner described above with reference to FIG. 8. It should be noted that the termination elements 48 coupled between the major side edge 32.3 of the power plane and the ground plane are equally spaced from each other, and that the spacing between termination elements 48 coupled to the opposed major side edge 32.4 is approximately the same. Specifically, the termination elements 48 coupled along major side edges 32.3 and 32.4 are spaced from each other by the distance 44, which corresponds to the width of the conceptual transverse strips into which the power plane 32 is divided as shown in FIG. 5. The distance 44 between termination elements 48 on the major side edges 32.3 and 32.4 furthermore need not be equal to the distance 42 between termination elements 48 coupled to the minor side edges 32.1 and 32.2 of the power plane 32.

As mentioned above, as the operating frequency of the power-ground plane construction 30 increases, effective termination dictates that the distance between the adjacent termination elements 48 decreases, and that the number of termination elements 48 located along the peripheral edge of the power plane 32 increases. At high frequencies, the distance between adjacent termination elements 48 is reduced to the extent that it becomes desirable to replace a plurality of discrete termination elements with a continuous length or strip element which couples a continuous portion of the edge of the power plane 32 to the ground plane 34. This construction provides a distributed termination, as opposed to the discrete termination provided by the termination elements 48 discussed above. For example, the four termination elements 48 shown coupled to the minor side edge 32.2 of the power plane 32 in FIG. 8 maybe substituted by a single, continuous length termination element 48 for a power-ground plane construction 30 operating at a predetermined frequency.

Figure 10:
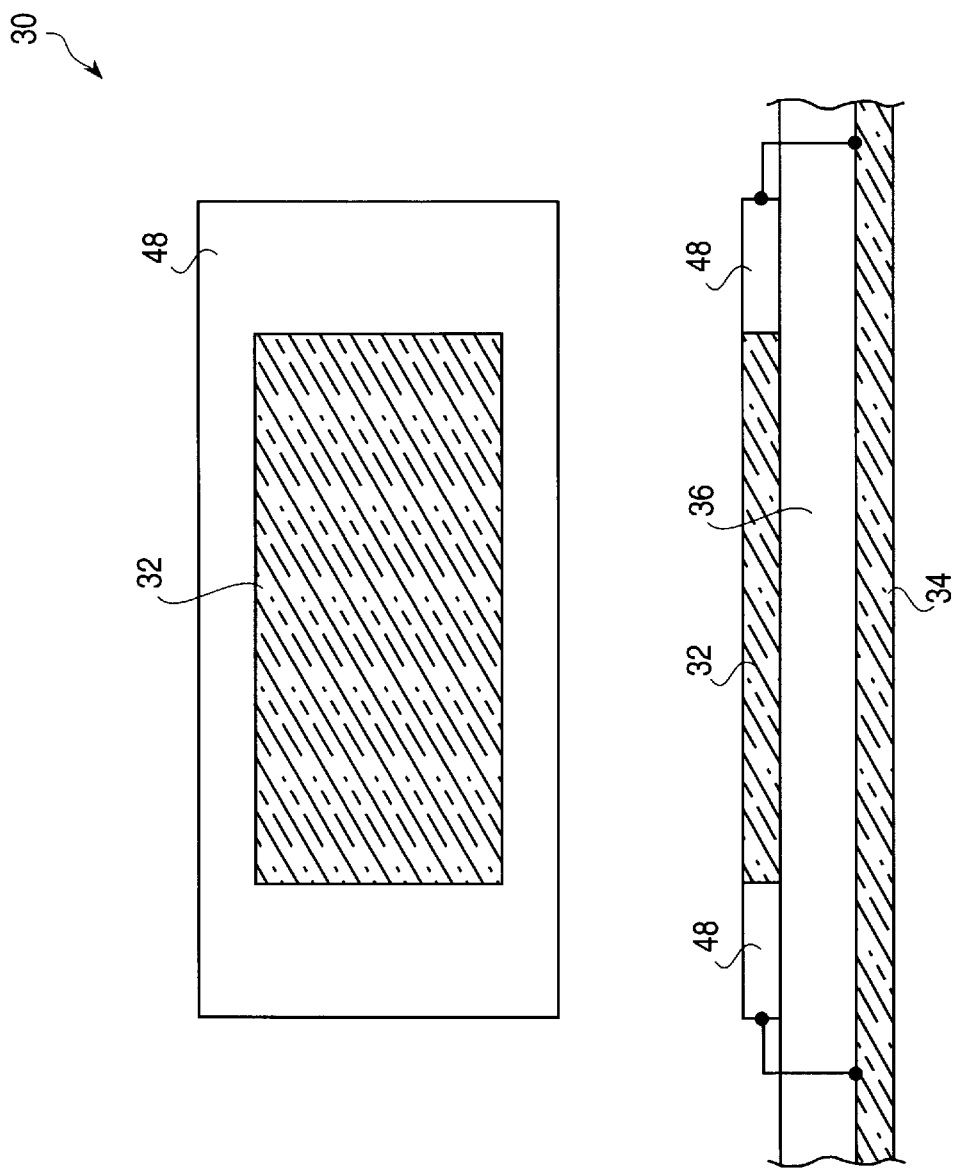
FIG. 10 shows plan and side views of a rectangular power-ground plane construction, the power plane being terminated along the entire peripheral edge thereof by a continuous length termination element according to the present invention.

In FIG. 10 there are shown plan and side views of yet a further embodiment of a power-ground plane construction 30 according to the invention. The power plane 32 is coupled along its entire peripheral edge by a continuous length termination element 48 to the ground plane 34. As with the discrete termination elements 48 described above, the continuous length termination element 48 shown in FIG. 10 has both resistive and capacitive properties. In one embodiment, the continuous length termination element 48 may be integral with the power plane 32, and comprises, for example, a thick film resistor. In another embodiment, the continuous length termination element 48 may be a separate component coupled to a continuous edge portion of the power plane 32. It will be appreciated that the continuous length termination element 48 need not couple the entire peripheral edge of the power planes 32 to ground, but could couple only specific continuous portions of the peripheral edge, as is dictated by performance and cost considerations. For example only opposed minor edges of the power plane 32 may be coupled by the continuous length termination element 48.

Figure 11:
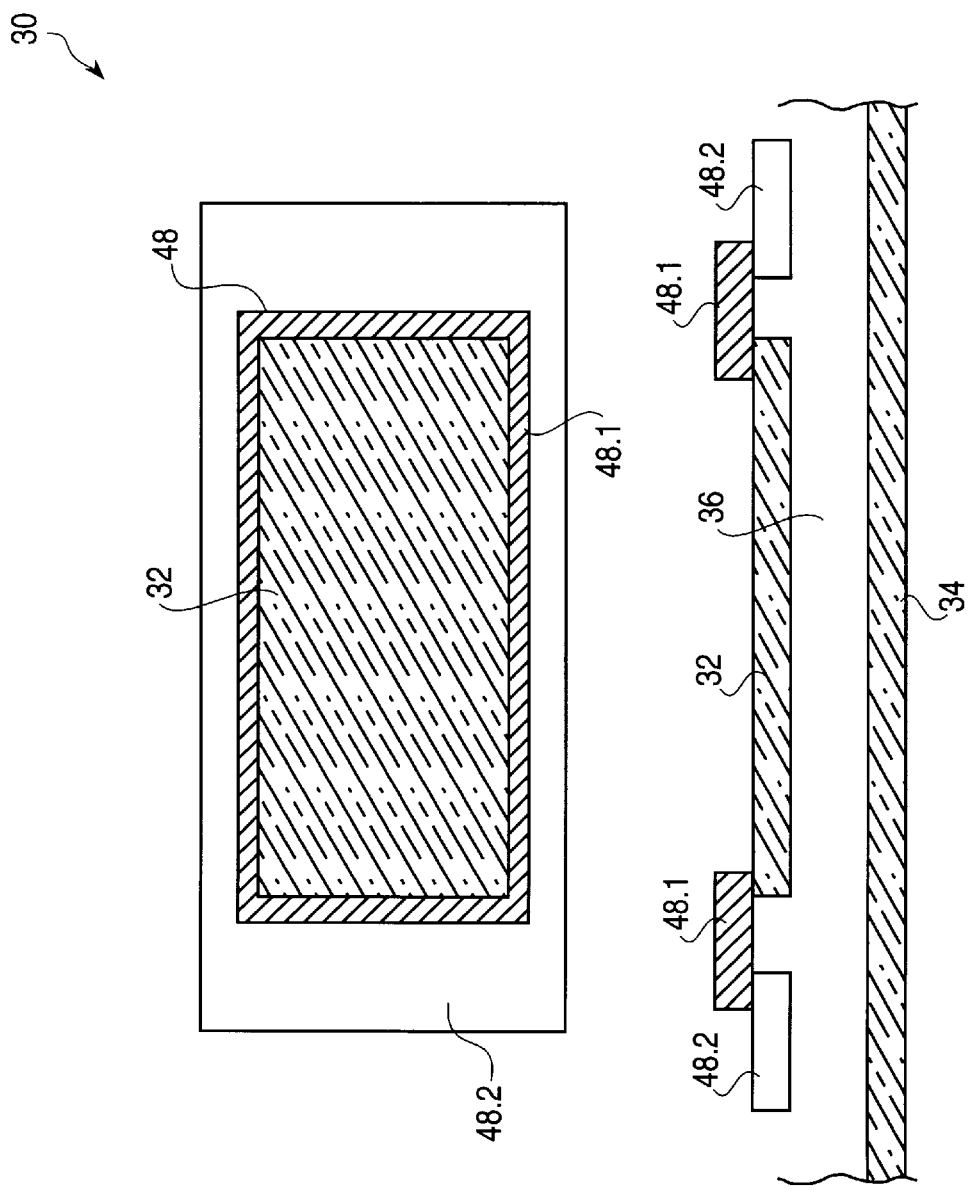
FIG. 11 shows plan and side views of a rectangular power-ground plane construction, the power plane being terminated along the entire peripheral edge thereof by a continuous length termination element or strip element, supplemented by intrinsic capacitance, according to a further embodiment of the present invention.

FIG. 11 shows plan and side views of yet another embodiment of a power-ground plane construction 30 having a power plane 32 terminated adjacent its peripheral edge. In this embodiment, the continuous length termination element 48 comprises a resistive component 48.1, which is physically coupled to the power plane 32. The capacitive component of the termination element 48 is provided by the intrinsic or interplanar capacitance that exists between the plane 48.2 and the ground plane 34, as a result of the proximity of these planes to each other. Accordingly, the side view shown in FIG. 11 shows the planes 48.2 and 34 to be in close proximity, so as to operationally create a desired degree of intrinsic capacitance at or adjacent the edge of the power plane 32.

Figure 12:
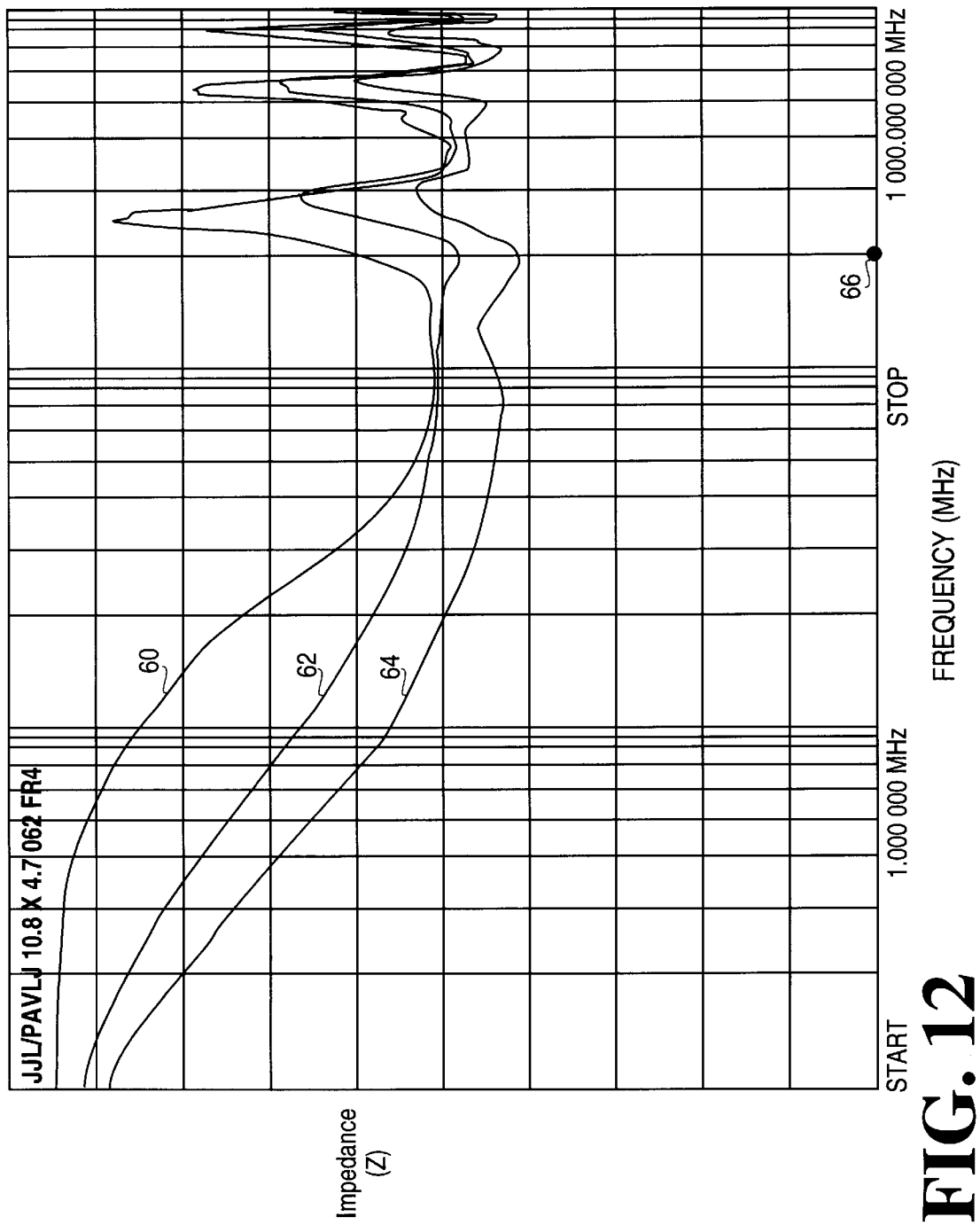
FIGS. 12 and 13 are graphs plotting the impedance of both unterminated and terminated power plane constructions, over two frequency ranges.

FIG. 12 is a logarithmic graph plotting the measured impedance of a power plane 32 over a frequency range of 1 MHz to 1000 MHz. The power plane 32 used to generate the graph was rectangular, and had dimension of 10.8 by 4.8 inches. The graph plots the impedance of the power plane 32 for three power-ground constructions, namely:

(1) Plot 60 indicates the impedance of the power plane when not terminated;

(2) Plot 62 shows the impedance of the power plane when terminated along only one edge thereof by discrete termination elements, each comprising a 1000 picofarad (pFd) capacitor and a 10 ohm resister; and (3) Plot 64 shows the impedance of the power plane when terminated along two opposed side edges thereof.

Figure 1:
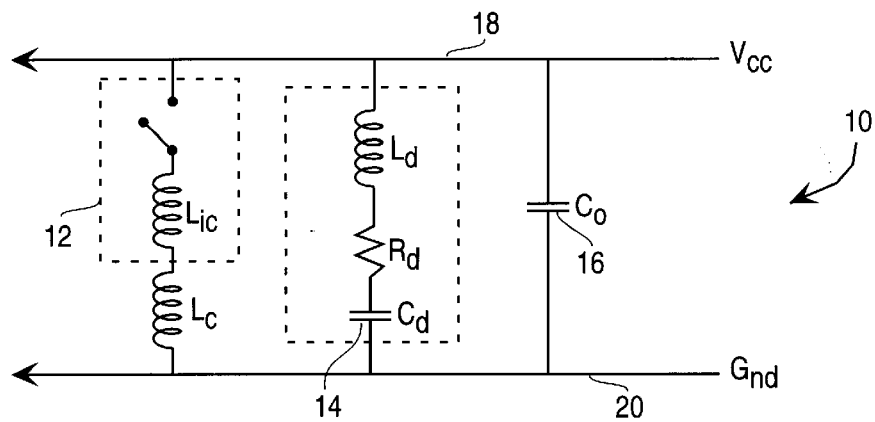
FIG. 1 shows an equivalent circuit representing an integrated circuit (IC) and associated decoupling capacitor mounted on a printed circuit board (PCB).
Figure 2:
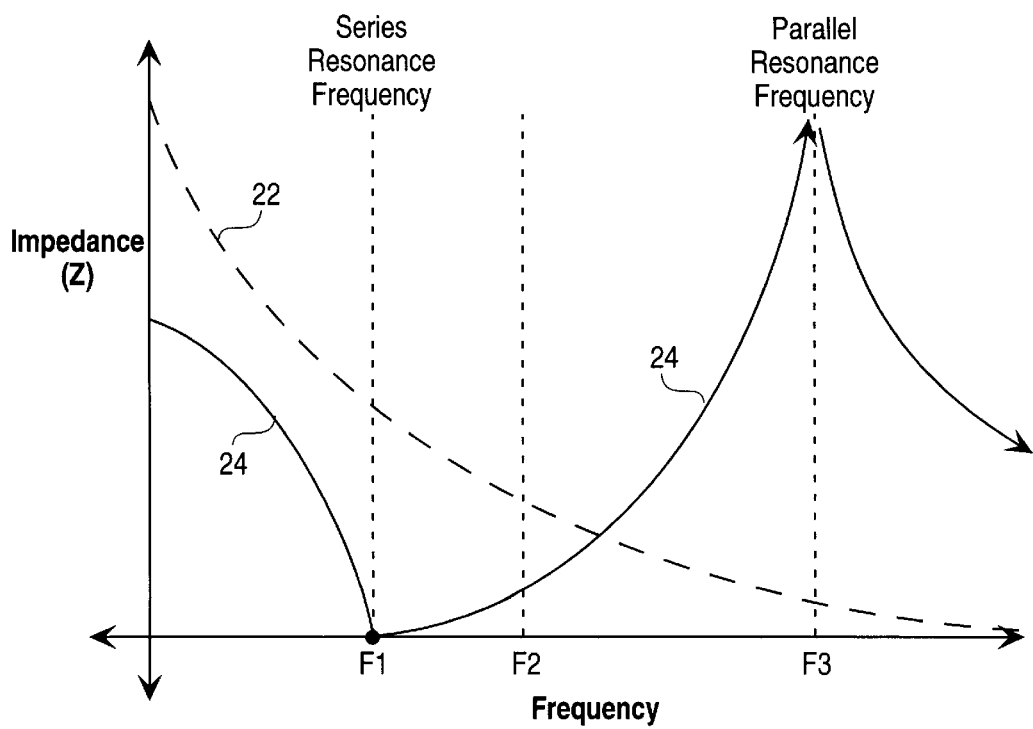
FIG. 2 is a graph plotting impedance of a power plane against frequency.

It will be appreciated that the shapes exhibited by the plots 60, 62 and 64 correspond roughly to the impedance characteristics plotted in FIG. 2. Most importantly, it will also be noted that the increase in impedance at frequencies beyond the frequency indicated at 66 is significantly attenuated by coupling the termination elements to the power plane at or adjacent an edge portion thereof. Accordingly, the tendency of the power-ground plane construction to malfunction at frequencies above the frequency indicated at 66 is greatly reduced.

Figure 13:
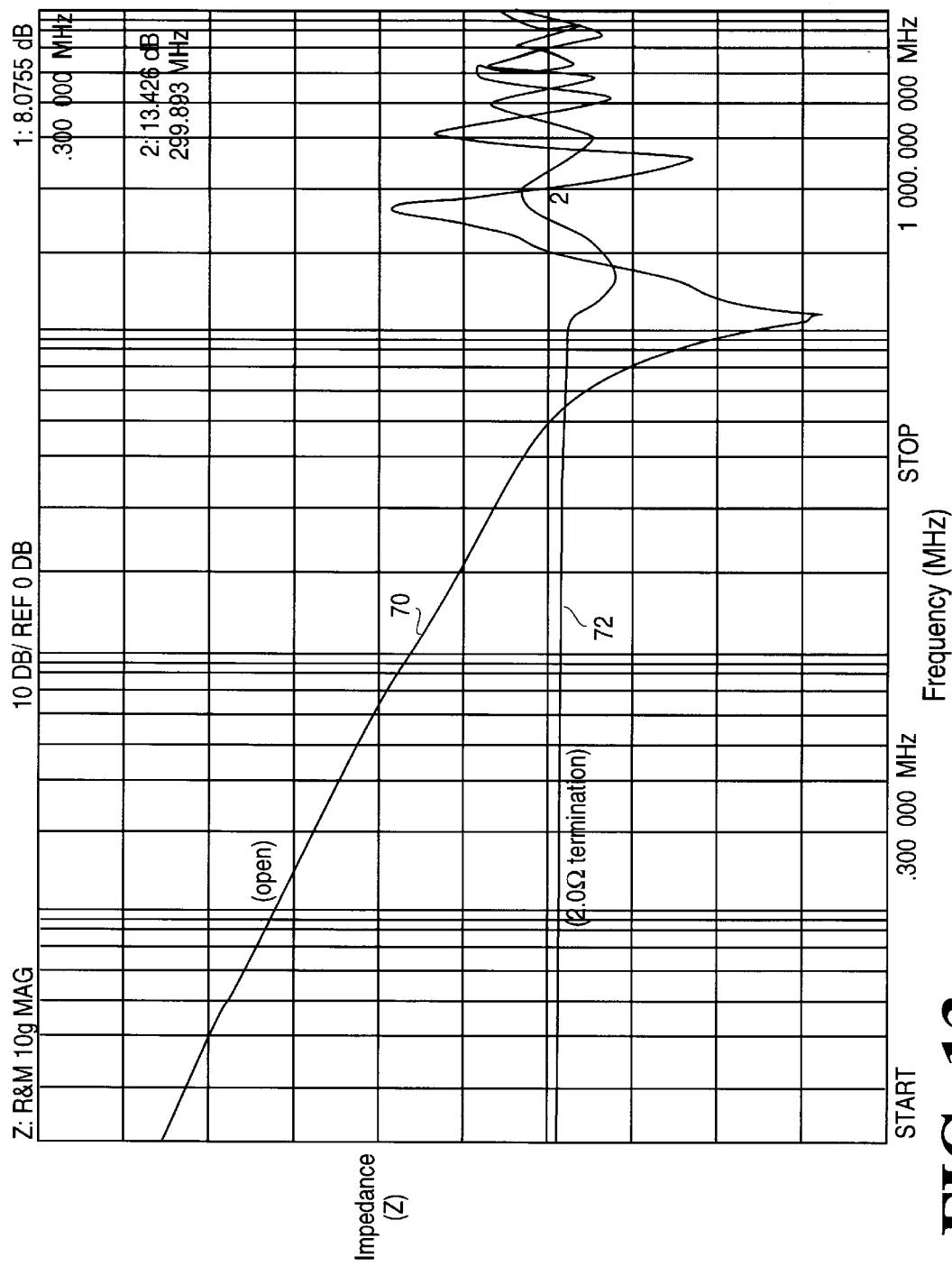

FIG. 13 is a logarithmic graph plotting impedance against frequency for a further power-ground plane construction having a 10.8 by 4.8 inch power plane, and provides a further illustration of the effect of terminating the power plane 32 thereof. Specifically, plot 70 indicates the impedance of a power-ground plane construction 30 with the power plane in an unterminated state, whereas plot 72 indicates the impedance of the same power-ground plane construction 30 when the power plane is terminated by a series of five discrete termination elements, each comprising a two (2) ohm resistor coupled in series with a five (5) microfarad ($\mu$Fd) capacitor. When compared to the graph of FIG. 12, the increased capacitance value of the termination elements is shown to decrease the impedance of the power plane at the low frequencies. Most importantly, it should be noted that the high frequency impedance of the terminated power plane, as depicted by plot 72, is lower than the impedance of the unterminated power plane, as depicted by plot 70, at the same high frequencies.

Thus, a terminated power plane, for use in a printed circuit board, has been described. Although the present invention has been described with reference to specific exemplary embodiments, it will be evident that various modifications and changes may be made to these embodiments without departing from the broader spirit and scope of the invention. Accordingly, the specification and drawings are to be regarded as illustrative rather than a restrictive sense.

What is claimed is:

1. A printed circuit board comprising:
   a dielectric layer;
   a power plane having a peripheral edge;
   a ground plane spaced from the power plane by the dielectric layer; and
   a termination element coupling the power plane to the ground plane at or adjacent a peripheral edge of the power plane so as to terminate the power plane and reduce resonances therein.

2. The printed circuit board of claim 1 including a plurality of termination elements coupling the power plane, at or adjacent the peripheral edge thereof, to the ground plane, and wherein the plurality of termination elements are spaced from each other at substantially regular intervals.

3. The printed circuit board of claim 2 wherein the power plane is substantially rectangular in shape and has first, second, third and fourth side edges, the plurality of termination elements coupling the power plane, at or adjacent the first side edge thereof, to the ground plane.

4. The printed circuit board of claim 3 wherein the first and third side edges of the power plane are located at opposed ends thereof, and the plurality of termination elements couple the power plane, at or adjacent the first and third side edges thereof, to the ground plane.

5. The printed circuit board of claim 3 wherein the plurality of termination elements couple the power plane, at or adjacent the first, second, third and fourth side edges thereof, to the ground plane.

6. The printed circuit board of claim 1 wherein the termination element comprises a discrete element having resistive and capacitive characteristics.

7. The printed circuit board of claim 1 wherein the termination element comprises discrete resistor and capacitor elements.

8. The printed circuit board of claim 2 wherein the plurality of termination elements are connected in parallel between the power and ground planes.

9. The printed circuit board of claim 1 wherein the termination element comprises a strip element coupling the power plane, at or adjacent a continuous edge portion thereof, to the ground plane.

10. The printed circuit board of claim 9 wherein the power plane is substantially rectangular in shape and has first, second, third and fourth side edges, the strip element coupling the power plane, at or adjacent the first side edge thereof, to the ground plane.

11. The printed circuit board of claim 10 wherein the first and third side edges of the power plane are located at opposed ends thereof, and the strip element couples the power plane, at or adjacent the first and third side edges thereof, to the ground plane.

12. The printed circuit board of claim 9 wherein the strip element couples the power plane, at or adjacent the entire peripheral edge thereof, to the ground plane.

13. The printed circuit board of claim 9 wherein the strip element has both resistive and capacitive elements, the resistive element comprising a resistor coupled to the power plane, at or adjacent a peripheral edge thereof, and the spacing between a plane coupled to the resistor and the ground plane creates an intrinsic capacitance to provide the capacitive element of the termination element.

14. A method of manufacturing a printed circuit board, the method including the steps of:

providing a dielectric layer having opposed first and second surfaces;

locating a power plane, having a peripheral edge, and a ground plane, on the first and second surfaces respectively, so that the power and ground planes are in a spaced, opposed relationship to each other; and coupling a termination element between a location on the power plane, at or adjacent the peripheral edge thereof, and the ground plane so as to terminate the power plane.

15. The method of claim 14 including the step of coupling a plurality of termination elements between the power plane, at or adjacent the peripheral edge thereof, and the ground plane, the termination elements being spaced from each other at substantially regular intervals.

16. The method of claim 15 wherein the power plane is substantially rectangular in shape and has first, second, third and fourth side edges, the method including the step of coupling the plurality of termination elements between the power plane, at or adjacent the first side edge thereof, and the ground plane.

17. The method of claim 16 wherein the first and third side edges of the power plane are located at opposed ends thereof, the method including the step of coupling the plurality of termination elements between the power plane, at or adjacent the first and third side edges thereof, and the ground plane.

18. The method of claim 16 including the step of coupling the plurality of termination elements between the power plane, at or adjacent the first, second, third and fourth sides edges thereof, and the ground plane.

19. The method of claim 14 wherein the termination element comprises a discrete element having resistive and capacitive characteristics.

20. The method of claim 14 wherein the termination element comprises discrete resistor and capacitor elements.

21. The method of claim 15 including the step of connecting the plurality of termination elements in parallel between the power and ground planes.

22. The method of claim 14 including the step of coupling a strip element between the power plane, at or adjacent a continuous portion of the peripheral edge thereof, and the ground plane.

23. The method of claim 22 wherein the power plane is substantially rectangular in shape and has first, second, third and fourth side edges, the method including the step of coupling the strip element between the power plane, at or adjacent the first side edge thereof, and the ground plane.

24. The method of claim 23 wherein the first and third side edges of the power plane are located at opposed ends of the power plane, the method including the step of coupling the strip element between the power plane, at or adjacent the first and third side edges thereof, and the ground plane.

25. The method of claim 22 including the step of coupling the strip element between the power plane, at or adjacent the entire respective peripheral edge thereof, and the ground plane.

* * * * *

UNITED STATES PATENT AND TRADEMARK OFFICE
CERTIFICATE OF CORRECTION

PATENT NO. : 5,898,576
DATED : April 27, 1999
INVENTOR(S) : Lockwood et al.

It is certified that error appears in the above-indentified patent and that said Letters Patent is hereby corrected as shown below:

On the title page item [54]

"PRINTED CIRCUIT BOARD" and insert -- A PRINTED CIRCUIT BOARD --.

In column 1, line 1, delete "PRINTED CIRCUIT BOARD" and insert -- A PRINTED CIRCUIT BOARD --.

Signed and Sealed this

Twentieth Day of March, 2001

Attest:

NICHOLAS P. GODICI

*Attesting Officer*   *Acting Director of the United States Patent and Trademark Office*